(12) United States Patent
Dorenkamp et al.

(10) Patent No.: US 10,681,829 B2
(45) Date of Patent: Jun. 9, 2020

(54) ELECTRICAL JUNCTION BOX WITH REMOVABLE SEALING COVER

(71) Applicant: SunPower Corporation, San Jose, CA (US)

(72) Inventors: James Dorenkamp, Portland, OR (US); Henry F. Pruett, North Bend, OR (US); Ravindranath Naiknaware, Portland, OR (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/682,708

(22) Filed: Aug. 22, 2017

(65) Prior Publication Data

US 2017/0354057 A1 Dec. 7, 2017

Related U.S. Application Data

(63) Continuation of application No. 14/814,585, filed on Jul. 31, 2015, now Pat. No. 9,763,360, which is a (Continued)

(51) Int. Cl.
*H05K 5/03* (2006.01)
*H05K 7/20* (2006.01)
(Continued)

(52) U.S. Cl.
CPC ............. *H05K 5/03* (2013.01); *H02S 40/345* (2014.12); *H05K 7/209* (2013.01); *H05K 7/2089* (2013.01); *H05K 5/0217* (2013.01); *H05K 5/0239* (2013.01); *H05K 5/0247* (2013.01); *H05K 7/1427* (2013.01); *H05K 7/205* (2013.01); *H05K 7/2039* (2013.01)

(58) Field of Classification Search
CPC ........................................................ H05K 5/06
See application file for complete search history.

(56) References Cited

U.S. PATENT DOCUMENTS 5,467,251 A 11/1995 Katchmar
5,708,566 A 1/1998 Hunninghaus
(Continued)

OTHER PUBLICATIONS

Molex, SolarSpec Junction Box and Cable Assemblies, Order No. 987650-4132_Rev.2, Data Sheet, 2011, 2 pages.
(Continued)

*Primary Examiner* — Zachary Pape
(74) *Attorney, Agent, or Firm* — Grasso PLLC

(57) ABSTRACT

An electrical assembly may include an enclosure having a base portion to attach the enclosure to a panel and a heat dissipating portion opposite the base portion, a circuit board having a first thermal interface on a first side of the board, a second thermal interface on a second side of the board, and a thermally conductive portion to provide enhanced thermal conduction between the first thermal interface and the second thermal interface, a power electronic device having a thermal interface coupled to the first thermal interface of the circuit board, a heat spreader arranged to transfer heat to the heat dissipating portion of the enclosure, and a thermally conductive pad coupled between the second thermal interface of the circuit board and the heat spreader.

20 Claims, 4 Drawing Sheets

Related U.S. Application Data continuation of application No. 13/100,243, filed on May 3, 2011, now Pat. No. 9,101,082.

(60) Provisional application No. 61/330,840, filed on May 3, 2010, provisional application No. 61/345,984, filed on May 18, 2010.

(51) Int. Cl.
| | | |
|---|---|---|
| *H05K 5/02* | (2006.01) | |
| *H05K 7/14* | (2006.01) | |
| *H02S 40/34* | (2014.01) | |

(56) References Cited

U.S. PATENT DOCUMENTS

| | | | | |
|---|---|---|---|---|
| 5,726,858 | A * | 3/1998 | Smith | H05K 7/20509 |
| | | | | 336/61 |
| 6,058,013 | A | 5/2000 | Christopher | |
| 6,104,611 | A | 8/2000 | Glover | |
| 6,540,543 | B1 * | 4/2003 | Watanabe | H01R 13/5213 |
| | | | | 439/354 |
| 6,696,643 | B2 | 2/2004 | Takano | |
| 7,023,699 | B2 | 4/2006 | Glovatsky | |
| 7,134,883 | B2 | 11/2006 | Werner | |
| 7,291,036 | B1 * | 11/2007 | Daily | H05K 7/20445 |
| | | | | 439/487 |
| 7,591,690 | B1 * | 9/2009 | Chien | H02S 40/34 |
| | | | | 439/709 |
| 7,686,337 | B2 * | 3/2010 | Myers | B62D 1/16 |
| | | | | 280/779 |
| 7,833,033 | B2 | 11/2010 | McMahon et al. | |
| 8,003,885 | B2 * | 8/2011 | Richter | H01R 4/28 |
| | | | | 136/244 |
| 8,040,678 | B2 * | 10/2011 | Tai | H02S 40/34 |
| | | | | 136/251 |
| 8,113,853 | B2 | 2/2012 | Coyle | |
| 8,248,804 | B2 | 8/2012 | Han | |
| 2003/0184969 | A1 * | 10/2003 | Itabashi | H05K 7/205 |
| | | | | 361/688 |
| 2003/0198022 | A1 | 10/2003 | Ye | |
| 2004/0233642 | A1 | 11/2004 | Ito | |
| 2008/0130234 | A1 | 6/2008 | Maehara | |
| 2008/0158817 | A1 | 7/2008 | Tsunoda | |
| 2008/0253092 | A1 * | 10/2008 | Duesterhoeft | H01L 31/02008 |
| | | | | 361/710 |
| 2008/0276663 | A1 * | 11/2008 | Hu | E05C 19/06 |
| | | | | 70/2 |
| 2009/0122492 | A1 | 5/2009 | Fischer et al. | |
| 2010/0254093 | A1 | 10/2010 | Oota | |
| 2010/0294528 | A1 | 11/2010 | Sella et al. | |
| 2011/0058337 | A1 | 3/2011 | Han et al. | |
| 2011/0168228 | A1 * | 7/2011 | McGreevy | H02S 40/34 |
| | | | | 136/244 |
| 2013/0003307 | A1 | 1/2013 | Jang | |
| 2013/0016474 | A1 | 1/2013 | Ger | |
| 2013/0146118 | A1 | 6/2013 | Kelley | |

OTHER PUBLICATIONS

Texas Instruments, "PowerPAD Layout Guidelines," Application Report, SLOA120—May 2006, 7 pages.
Texas Instruments, "PowerPAD Thermally Enhanced Package," Application Report, SLMA002G—Nov. 1997, Revised Jan. 2011, 32 pages.
NXP, "LFPAK—The Toughest Power-SO8," Dec. 2009, 12 pages.
The Bergquist Company, "Thermal Clad Design Guide with New HTV Materials," Jan. 2001, Revision 15, 42 pages.
Molex, "SolarSpec—Interconnect Solutions for the Solar Industry," 2010, 8 pages.
The Bergquist Company, Product Catalog, Dec. 2008, 96 pages.
Ahmadi, H. "Calculating Creepage and Clearance Early Avoids Design Problems Later," downloaded from Internal on May 3, 2011, 7 pages.
Creative Commons, "Transformer Types," May 2, 2011, 10 pages.
Ferroxcube, "Design of Planar Power Transformers—Application Note," May 2, 2011, 16 pages.
Wikipedia, "Transformer Types," Circuit Symbols, May 2, 2011, 10 pages.

\* cited by examiner

ELECTRICAL JUNCTION BOX WITH REMOVABLE SEALING COVER

CROSS-REFERENCE TO RELATED APPLICATIONS

This application is a continuation of U.S. application Ser. No. 14/814,585, which was filed on Jul. 31, 2015, and is entitled Serviceable Electrical Box Thermal Management, and which is now U.S. Pat. No. 9,763,360. The '585 application is a continuation of U.S. application Ser. No. 13/100,243, which was filed on May 3, 2011 and is now U.S. Pat. No. 9,101,082. The '243 application claims the benefit of priority from U.S. Provisional Patent Application Ser. No. 61/330,840 entitled Electrical Box Thermal Management filed May 3, 2010, and from U.S. Provisional Patent Application Ser. No. 61/345,984 titled Serviceable Electrical Box Thermal Management filed May 18, 2010.

BACKGROUND

FIG. 1 is a simplified cross-sectional view of a prior art junction box for a solar panel that utilizes photovoltaic (PV) cells to convert solar energy into electric power. The junction box 10 includes a plastic box 12 having a base portion 14 for mounting the box to a solar panel 16. A plastic cover 18 engages the box to seal off the inside of the box from moisture, dust and other contaminants. A printed circuit board 20 includes circuitry for making connections between conductive leads from the panel and cables that carry power to a power distribution system. The conductive leads and cables are omitted from FIG. 1 to avoid obscuring the remaining structure of the junction box.

The printed circuit board 20 also includes one or more bypass diodes 22 which are used to prevent damage to the solar panel or other components and improve efficiency under certain operating conditions. The diode 22 shown in FIG. 1 has a plastic package body 24 and a metallic slug 26 which acts as a heat sink to dissipate heat generated within the diode body. The diode 22 is electrically connected to the printed circuit board 20 through wire leads 28.

To prevent damage to the diode if it overheats, the plastic body of the diode is positioned in physical contact with a thermally conductive plate 30 which is bonded to the cover 18. The thermally conductive plate 30 is fabricated from a metal such as copper or aluminum and acts as a heat spreader to distribute heat from the diode across a relatively large surface area of the cover, thereby enabling heat from the diode to be dissipated through the cover of the junction box.

The diode is designed to dissipate heat primarily through the metallic slug which forms a thermal interface with the printed circuit board. Since the printed circuit board only has a limited capacity to dissipate heat, the conductive plate enables some additional heat to be dissipated through the plastic body of the diode, which has relatively low thermal conductivity. Thus, the prior art arrangement of FIG. 1 fails to fully utilize the primary heat dissipating mechanism of the diode, and it provides poor thermal management.

DETAILED DESCRIPTION

Figure 1:
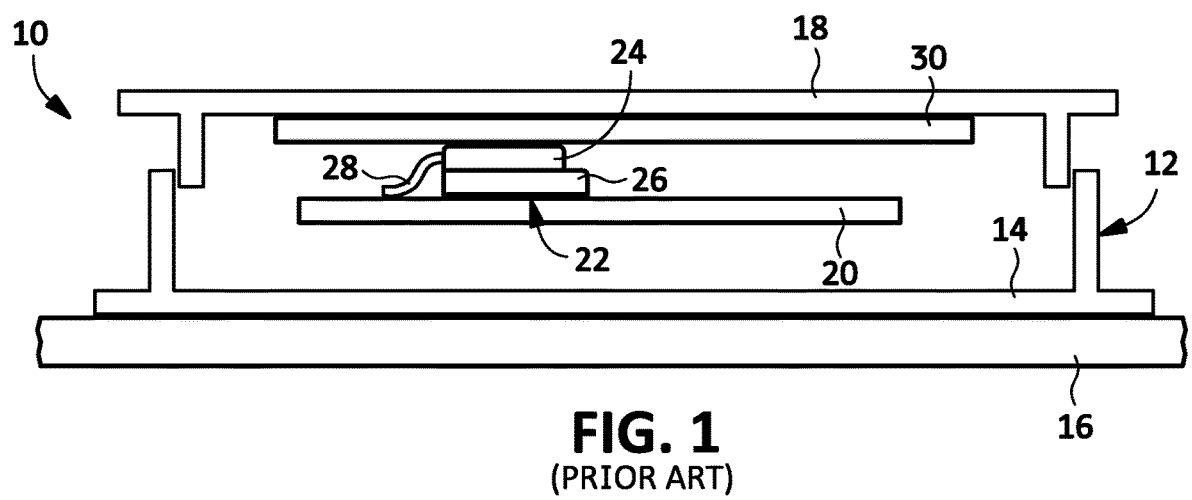
FIG. 1 illustrates a prior art junction box for a solar panel.
Figure 2:
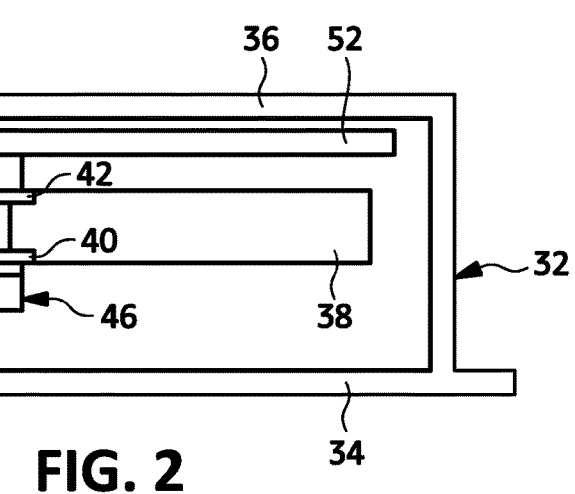
FIG. 2 illustrates an embodiment of an electrical assembly according to some inventive principles of this patent disclosure.

FIG. 2 is a cross-sectional view of an embodiment of an electrical assembly according to some inventive principles of this patent disclosure. The embodiment of FIG. 2 may be suitable for use as a junction box for a solar panel, but the inventive principles are not limited to solar panels.

Referring to FIG. 2, the electrical assembly includes an enclosure 32 having a base portion 34 to attach the enclosure to a panel and a heat dissipating portion 36 opposite the base portion. A circuit board 38 has a first thermal interface 40 on a first side of the board, a second thermal interface 42 on a second side of the board, and a thermally conductive portion 44 to provide enhanced thermal conduction between the first thermal interface and the second thermal interface. A power electronic device 46 has a thermal interface 50 coupled to the first thermal interface 40 of the circuit board 38. A heat spreader 52 is arranged to transfer heat to the heat dissipating portion 36 of the enclosure 32. A thermally conductive pad 54 is coupled between the second thermal interface 42 of the circuit board 38 and the heat spreader 52.

Figure 3:
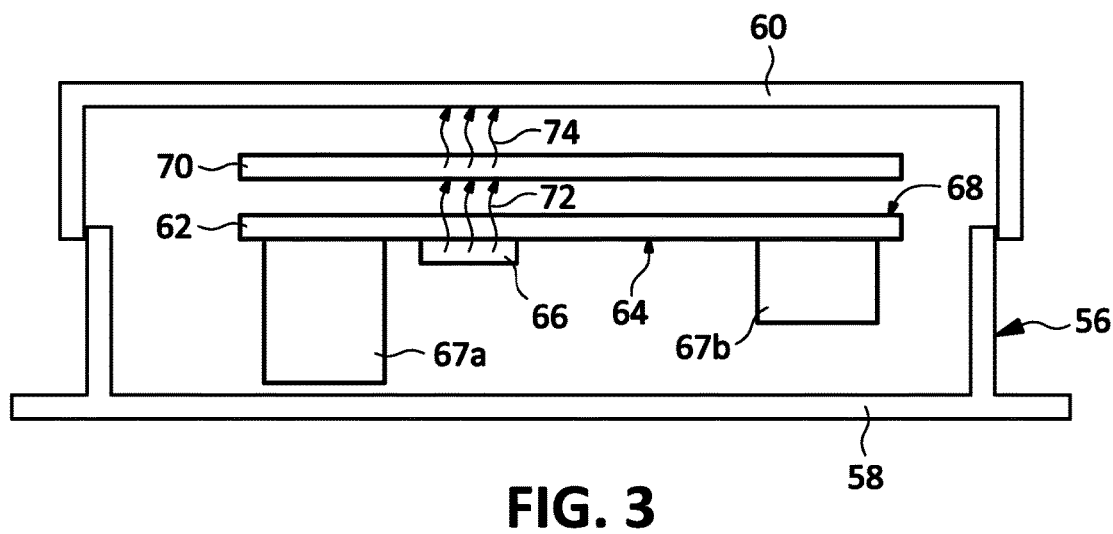
FIG. 3 illustrates another embodiment of an electrical assembly according to some inventive principles of this patent disclosure.

FIG. 3 is a cross-sectional view of another embodiment of an electrical assembly according to some inventive principles of this patent disclosure. The embodiment of FIG. 3 may also be suitable for use as a junction box for a solar panel, but the inventive principles are not limited to use with solar panels.

Referring to FIG. 3, the electrical assembly includes a box 56 having a base portion 58 to attach the enclosure to a panel and an opening opposite the base portion. The assembly also includes a cover 60 to engage the opening of the box. A circuit board 62 has a first side, a high-profile side 64, with at least one power electronic device 66 mounted thereon, and a second side, a low-profile side 68. A thermally conductive plate 70 is mounted adjacent to the second side 68 of the circuit board 62. The circuit board is constructed and arranged to transfer heat from the power electronic device to the thermally conductive plate as shown by arrows 72. The thermally conductive plate is arranged to transfer heat to the cover when the cover is engaged with the opening of the box as shown by arrows 74.

The high-profile side 64 of the circuit board may include additional components such as 67A and 67B having relatively high-profiles, while the low-profile side 66 may have components with a relatively small profile mounted thereon.

Figure 4:
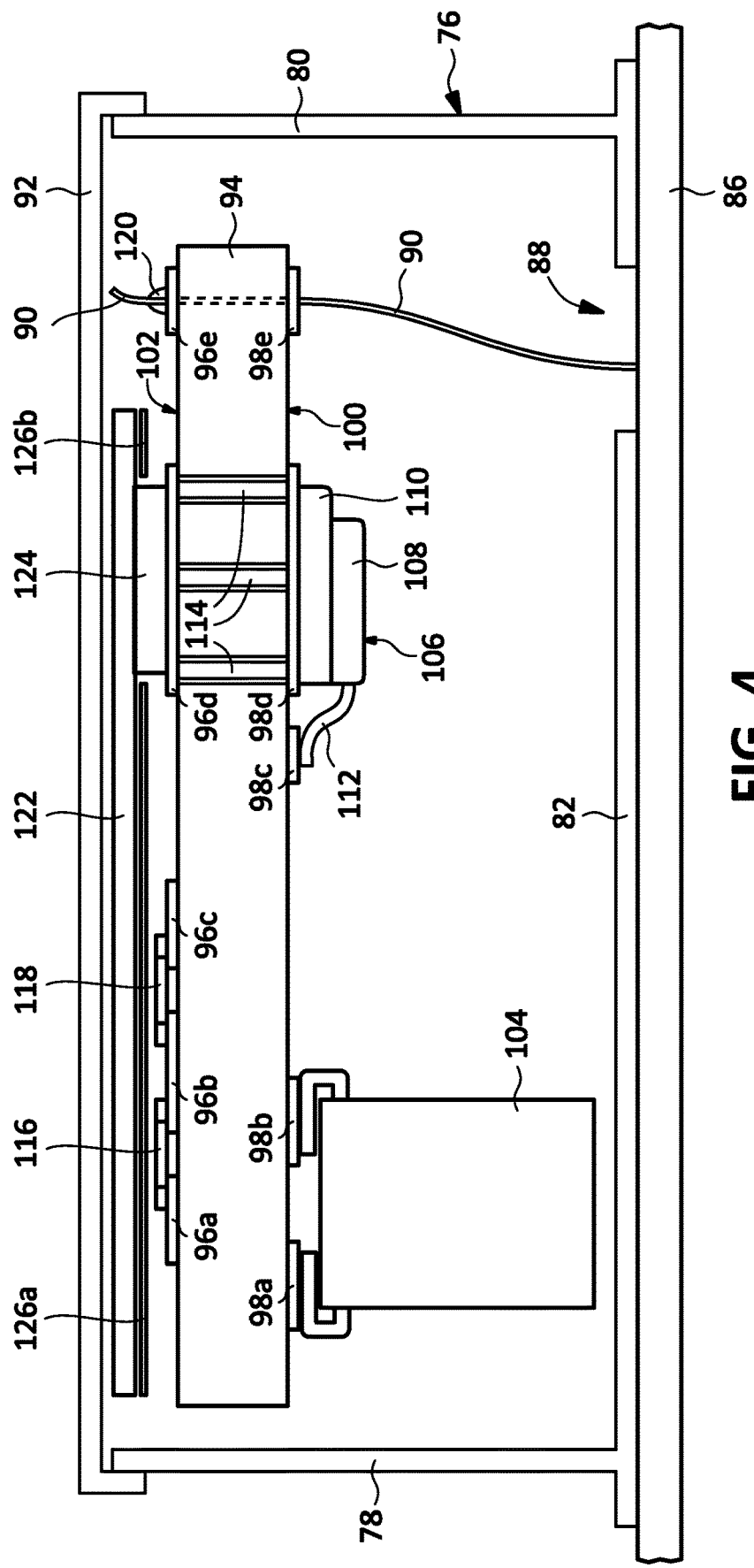
FIG. 4 illustrates an example embodiment of an electrical assembly according to some inventive principles of this patent disclosure.

FIG. 4 illustrates an example embodiment of an electrical assembly showing some possible implementation details according to some inventive principles of this patent disclosure. The embodiment of FIG. 4 is described in the context of a junction box for a solar panel, but the inventive principles are not limited to use with solar panels or to any of the implementation details shown. The embodiment of FIG. 4 is not shown to scale, and some of the dimensions are exaggerated for purposes of illustration.

Referring to FIG. 4, the junction box includes a box 76 having sidewalls 78 and 80, and a base 82 for mounting the junction box to a solar panel 86. Connections from the solar panel are made through conductive leads (which in this example are ribbon conductors) 90 that pass through one or more openings 88 in the base. A cover 92 seals the junction box from moisture, dust and other contaminants, and also dissipates heat that is generated by components inside the box. The box 76 and cover 92 may be fabricated from plastic such as ABS or any other suitable nonconductive material. A conductive material may be used for the box and/or cover, but additional measures may be needed to provide electrical isolation from the other components.

A printed circuit board 94 includes a first metal layer 96 and a second metal layer 98 which are etched to form any suitable circuits on the board. The first and second layers 96 and 98 are shown in sections or traces 96a, 96b, etc., and 98a, 98b, etc., due to patterning that is exposed by the cross-sectional nature of the drawing. The first and second layers may also be referred to as low-profile and high-profile layers, respectively, in reference to the types of components that may be mounted on the board as explained below. The first and second layers may also be referred to, somewhat arbitrarily, as top and bottom layers, respectively. Likewise, the designations of first and second are also arbitrary. The board may also include any other number of conductive layers between the first and second layers.

The second or bottom side 100 of the board 94 is also referred to as the high-profile side of the board because it may be populated with relatively high-profile components such as microcontrollers, logic chips, gate arrays, transformers, large capacitors, large inductors, switching transistors, power diodes, transceiver chips, etc., that may be used to implement any suitable electric circuitry that may be housed within the enclosure of the junction box. The circuitry may be as simple as one bypass diode, or it may include one or more complete power converters such as a DC/DC power optimizer, one or more DC/AC panel-level, string-level, or cell-level microinverters, etc.

For purposes of illustration, the embodiment of FIG. 4 is assumed to include a DC/DC converter with local power optimization including maximum power point tracking (MPPT) for the solar panel 86. The converter circuitry includes a power inductor 104 having leads soldered to traces 98a and 98b. The converter circuitry includes other power and control components that are not visible in this cross-sectional view. A bypass diode 106 has a plastic body 108 and metallic slug 110 which forms a thermal interface. The bypass diode 106 is electrically connected to traces such as 98c through leads such as 112.

A portion 98d of the bottom metal layer forms a solder pad and thermal interface for the circuit board. Thus, with the diode 106 soldered to pad 98d, the thermal interface 98d for the bottom of the board is coupled to the thermal interface 110 of the diode to facilitate highly effective heat flow from the diode to the circuit board.

The solder pad 98d is thermally coupled to another solder pad 96d on the opposite side of the board through a thermally conductive portion of the board to provide enhanced thermal conduction between the bottom thermal interface 98d and the top thermal interface 96d. In the embodiment of FIG. 4, the thermally conductive portion of the board is implemented with thermal vias 114 which are plated-through holes that connect the two pads.

The first or top side 102 of the board 94 is also referred to as the low-profile side of the board because it may be populated with relatively low-profile components 116 and 118 such as resistors and small capacitors, signal diodes, small transistors, etc. For example, in some embodiments, the components on the low-profile side of the board may be limited to a height of about one millimeter (1 mm) or less.

Solder pads 96e and 98e provide a connection point for connecting the ribbon leads 90 to the circuit board 94. In this example, solder 120 is shown as the connection technique, but any other suitable technique such as spring clips, screws, etc. may be used.

A thermally conductive plate 122 is coupled to the top thermal interface 96d through a thermally conductive pad 124. An example of material suitable for the pad 124 is Bergquist Gap Pad. The thermally conductive plate operates as a heat spreader to eliminate hot spots and is arranged to transfer heat to the cover 92 which dissipates heat from the junction box and away from the solar panel 86. The plate 122 may be attached to the circuit board 94 in any suitable manner. For example, if the plate is made of copper or aluminum, screws may pass through holes in the circuit board and be threaded into the plate with spacers used to maintain the distance between the board and the plate.

An electrically insulating sheet 126 may be included between the plate 122 and the circuit board 94 to prevent shorting of traces or components on the low-profile side of the board. In this view, the sheet 126 is shown as sections 126a and 126b due to the hole through which the thermally conductive pad 124 passes. An example of material suitable for the electrically insulating sheet is polycarbonate or polypropylene sheet such as Formex polypropylene sheet from ITW Formex.

The embodiment of FIG. 4 may also include power connections for connecting the DC/DC converter to a power distribution system. Such connections are not shown in FIG. 4 so as not to obscure the other inventive features, but the power connections may be made in any suitable manner such as through solder connections to the circuit board, screw terminals, etc.

The circuit board and thermally conductive plate may be mounted in and/or to the box 76 and/or cover 92 in any suitable manner. For example, if the plate is attached to the circuit board as described above, the circuit board may be mounted to the box with standoffs and screws. Alternatively, the plate may be mounted to the box using tabs on the plate that slide or snap into slots and/or resilient structure. As another example, the plate may be mounted to the cover with screws, double-sided tape, adhesives, etc.

The inventive principles illustrated with respect to the embodiment of FIG. 4, as well as the other embodiments disclosed herein, may provide numerous benefits and advantages. For example, circuit boards are typically fabricated with all or most of the high-profile components on one side. The high-profile components may include components that dissipate significant heat such as power electronic devices like bypass diodes and switching transistors. It may be difficult, however, to provide individual heat sinking to these components in a manner that enables the heat to be removed from the interior of the junction box. The embodiment of FIG. 4, however, may provide a highly effective thermally conductive path from the bypass diode through the circuit board, the thermally conductive pad, the thermally conductive plate and out through the cover of the junction box. This may eliminate the need for individual heat sinks while also eliminating hot spots within the junction box. It may also enable the use of a single heat spreader to be used with multiple pads and heat dissipating components, thereby reducing assembly costs and improving reliability.

Although the inventive principles are not limited to use with solar panels, they may provide some features that are particularly beneficial when applied to solar panels. For example, if an electronic module embedded in a solar panel creates a hot spot on the PV array, it may increase the mismatch between PV cells, thereby degrading performance and reducing reliability due to higher localized temperature cycles. The inventive principles may enable most of the heat generated within a junction box module to be radiated away from the panel, thereby improving performance and long-term reliability. Moreover, the inventive principles may enable the implementation of enclosures having lower height profiles which may be critical due to mounting, regulatory and cost constraints.

Figure 5:
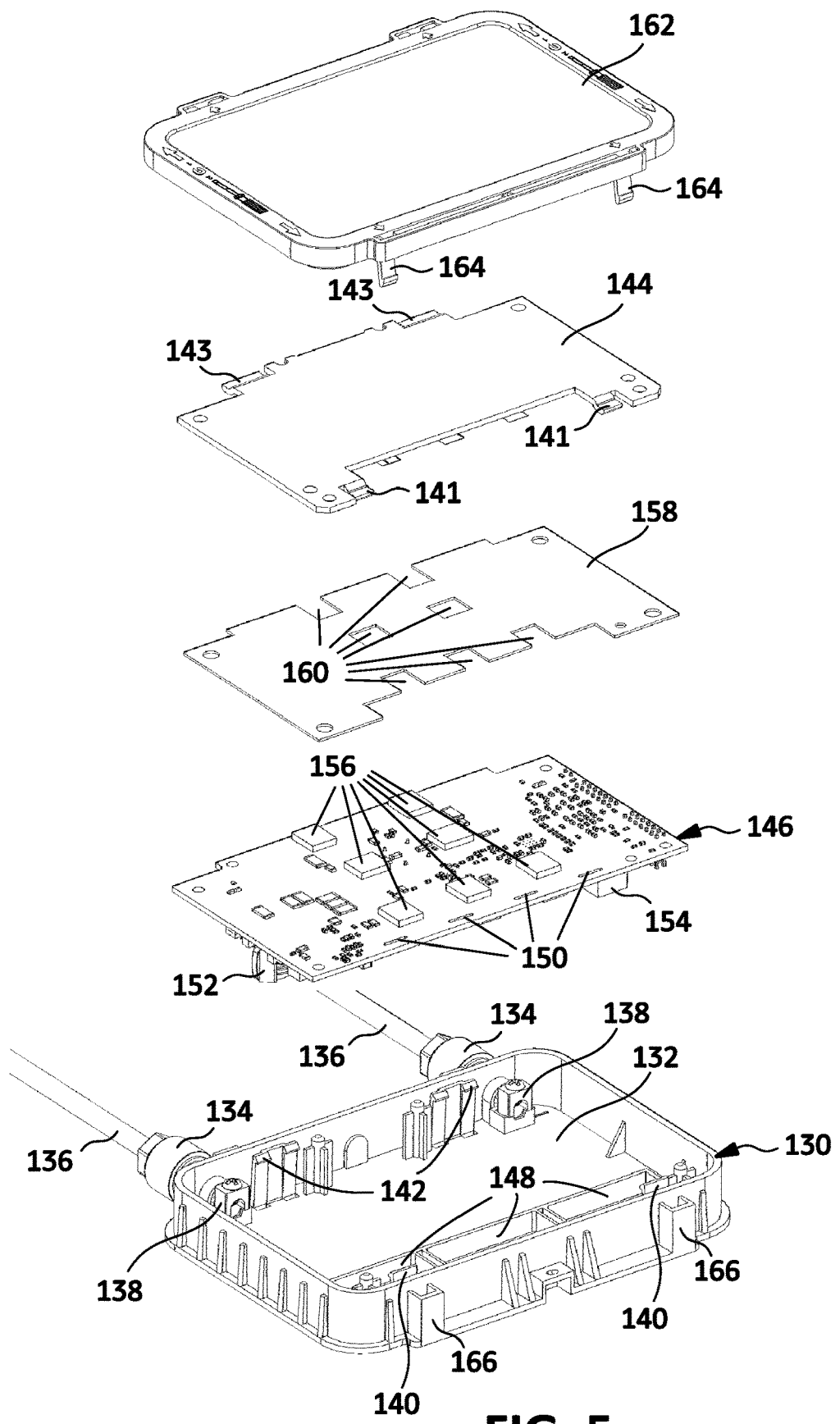
FIG. 5 illustrates another example embodiment of an electrical assembly according to some inventive principles of this patent disclosure.

FIG. 5 is an exploded view illustrating another example embodiment of a junction box according to some inventive principles of this patent disclosure.

The embodiment of FIG. 5 includes a plastic box 130 having a base portion 132 to attach the junction box to panel connectors 134 to secure cables 136 to the box for connecting the circuitry inside the junction box to a power distribution system. Screw terminals 138 enable the cables to be connected to solder-lug connectors on the printed circuit board 146. Hooks 140 engage tabs 141 on thermally conductive plate 144, while resilient latches 142 engage additional tabs 143 on the plate to enable the plate to be snapped into the box.

Channels 148 in the box enable ribbon leads from a solar panel to pass through the box to slots 150 on the circuit board 146 where they may be soldered to pads on the board. The printed circuit board 146 includes numerous low-profile components on the top side, and a few high-profile components such as transformer 152 and inductor 154 are visible on the high-profile side of the board. Seven thermally conductive pads 156 are attached to the board at locations having through vias and solder pads which provide thermally conductive connections to power electronic devices such as bypass diodes that are located on the high-profile side of the board but are not visible in the view of FIG. 5.

An electrically insulating sheet 158, which is positioned between the circuit board and plate includes openings 160 to enable the thermally conductive pads 156 attached to the circuit board to pass through the insulating sheet and contact the thermally conductive plate.

The circuit board is attached to the thermally conductive plate using standoffs and screws, while capturing the insulating sheet between them.

Plastic cover 162 has resilient tabs that engage corresponding channels 166 on the box to secure the cover on place on the box.

Figure 6:
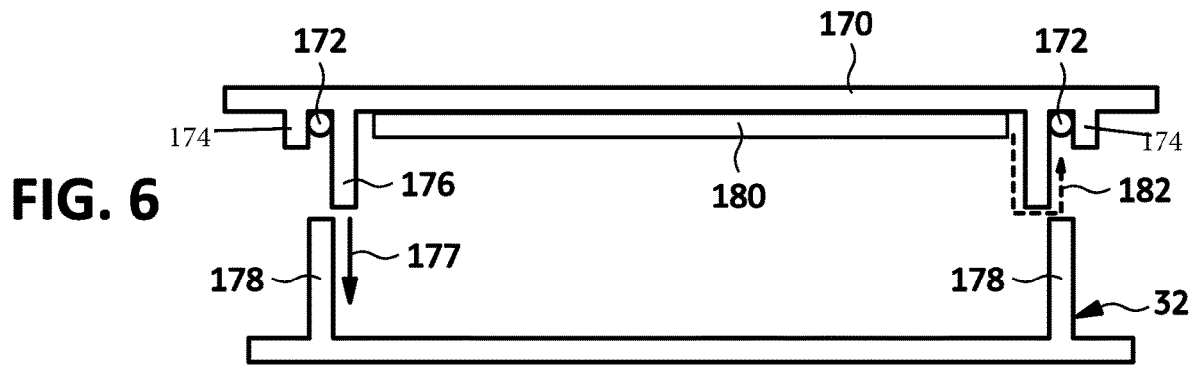
FIG. 6 illustrates an embodiment of a cover for an electrical enclosure according to some inventive principles of this patent disclosure.

FIG. 6 is a cross-sectional view of an embodiment of a box and cover for an electrical enclosure according to some inventive principles of this patent disclosure. The embodiment of FIG. 6 includes a box 32 and a cover 170 having an o-ring 172 disposed in a groove that runs around the entire circumference of the cover. The groove is formed between two rims 174 and 176 which contain the o-ring and are spaced to receive the side walls 178 of the box when the cover is moved into position on the box as shown by arrow 177. The presence of a thermally conductive plate 180, such as those described above, may necessitate clearance or creepage distance to the outside of the box to meet safety agency requirements. Therefore, the inner rim 176 is elongated in a direction perpendicular to the cover to provide increased creepage distance as shown by arrow 182.

Figure 7:
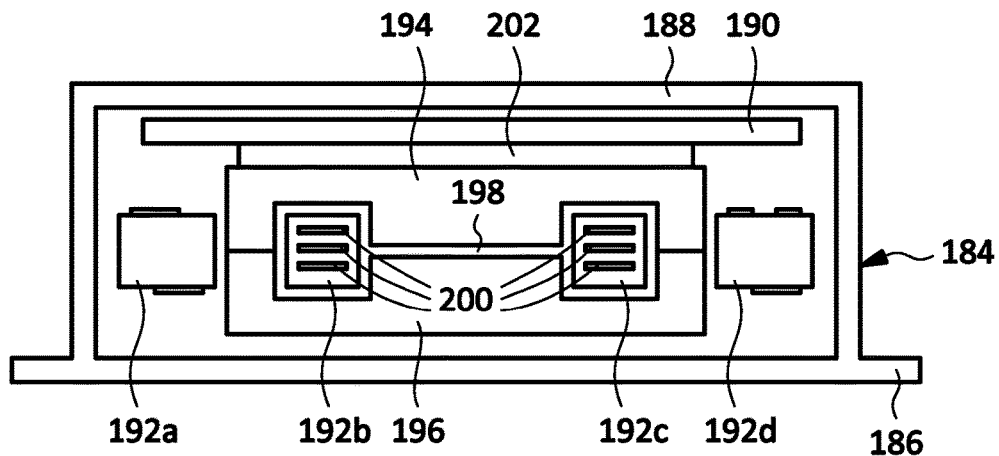
FIG. 7 illustrates an embodiment of an electrical assembly including planar magnetics according to some inventive principles of this patent disclosure.

FIG. 7 is a cross-sectional view illustrating an embodiment of an electrical assembly including planar magnetics according to some inventive principles of this patent disclosure. The embodiment of FIG. 7 includes an enclosure 184 having a base portion 186 to attach the enclosure to a panel and a heat dissipating portion 188 opposite the base portion. A heat spreader 190, which in this example is implemented as a thermally conductive plate, is arranged to transfer heat to the heat dissipating portion of the enclosure.

An inductor is fabricated as part of a circuit board 192, which is shown as sections 192a, 192b, 192c and 192d because it includes slots to receive the legs of two magnetic core halves 194 and 196. The center legs of each core are shorter than the outer legs to provide an air gap 198 to prevent saturation of the core. The windings of the inductor are formed as conductive traces 200 which are formed on multiple layers of the circuit board and connected by vias which are not visible in this view.

The top core 194 may be coupled to the thermally conductive plate 190 through a thermally conductive pad 202. Alternatively, the top core 194 may directly contact the thermally conductive plate 190, it may be bonded with adhesive, or a thermal connection may be formed in any other suitable manner. The two magnetic core halves 194 and 196 may be held in place with adhesive, clips, or any other suitable technique.

The inventive principles illustrated with respect to FIG. 7 may be combined with the other inventive principles disclosed herein relating to removing heat from electric assemblies to create further synergistic results.

A potential advantage of the inventive principles relating to planar magnetics illustrated with respect to FIG. 7 is that they may enable the creation of reduced height structures that are cost effective and provide excellent manufacturing repeatability. Power magnetics cores in typical power electronics can reach elevated temperature. The inventive principles disclosed herein may provide reduced height structures while simultaneously enabling a magnetic core to be directly attached to a heat sink or through a thermal-pad. Alternatively, a magnetic core may be attached to a heat sink through an electrically insulating material as described above.

Figure 8:
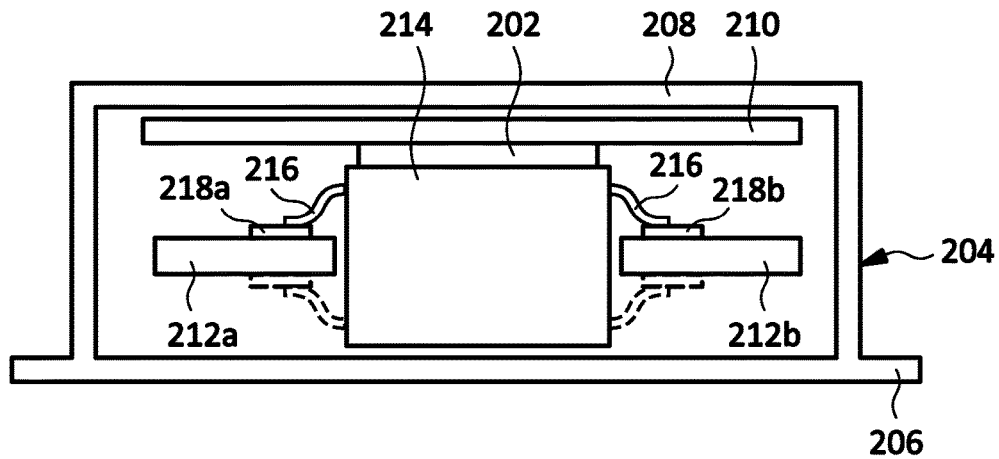
FIG. 8 illustrates an embodiment of an electrical assembly including through-board mounted components according to some inventive principles of this patent disclosure.

FIG. 8 is a cross-sectional view illustrating an embodiment of an electrical assembly including through-board mounted components according to some inventive principles of this patent disclosure. The embodiment of FIG. 8 includes an enclosure 204 having a base portion 206 to attach the enclosure to a panel and a heat dissipating portion 208 opposite the base portion. A heat spreader 210, which in this example is implemented as a thermally conductive plate, is arranged to transfer heat to the heat dissipating portion of the enclosure.

A circuit board 212 is shown as sections 212a and 212b because it includes an opening for a through-board mounted component 214. The component 214 is mounted to the board through leads 216 which may be soldered to metal traces 218a and 218b on top of the board. Alternatively, or in addition, the component 214 may be mounted to the board through leads soldered to metal traces on the bottom of the board as shown with the broken lines in FIG. 8.

The through-board mounted component 214 may be thermally coupled to the thermally conductive plate 210 through a thermally conductive pad 202 as shown in FIG. 8. Alternatively, it may be thermally coupled through direct contact, or through any other suitable arrangement.

The inventive principles illustrated with respect to FIG. 8 may be combined with the other inventive principles disclosed herein to create further synergistic results.

A potential advantage of the inventive principles relating to through-board mounted components illustrated with respect to FIG. 8 is that they may further reduce the height of an enclosure in which the components are mounted.

The inventive principles of this patent disclosure have been described above with reference to some specific example embodiments, but these embodiments can be modified in arrangement and detail without departing from the inventive concepts. Such changes and modifications are considered to fall within the scope of the claims following the Appendices.

What is claimed is:

1. A junction box system comprising:
   a plastic cover;
   a plastic box, the plastic box having a plurality of walls and a base portion connected to each of the walls, the plastic box configured to mate with the plastic cover, the plastic cover configured to engage with the walls and when engaged to the walls form a seal serving to protect components positioned inside of the mated plastic box and plastic cover;
   a first solar panel connector and a second solar panel connector; the first solar panel connector forming a first externally sealed passageway into the box, the second solar panel connector forming a second externally sealed passageway into the box;
   a plurality of electrical terminals secured to the plastic box, the plurality of electrical terminals providing connection points for electronics of a printed circuit board, mounted within the plastic box, to electrically connect with solar panel leads entering the plastic box, the printed circuit board comprising a microcontroller, a top surface, and a bottom surface, the top surface facing the plastic cover, the bottom surface having electrical connections to the electrical terminals; and
   an inductor electrically coupled to the printed circuit board and extending beyond the bottom surface and towards the base portion when the plastic cover and the plastic box are coupled,
   wherein the plastic cover has a top side, a bottom side, and a bottom rim projecting from the bottom side, the bottom rim positioned to surround the plurality of walls of the plastic box when the plastic box is mated to the plastic cover, and
   wherein the plastic cover and the plastic box are mated via a first channel positioned outside a wall of the plastic box, the first channel having an open top and a side spaced away from a wall of the plastic box, the space configured to receive a portion of the plastic cover.

2. The junction box system of claim 1 wherein the plurality of walls are connected and form a rectangular shape with rounded corners, the corners mimicking rounded corners of the plastic cover and wherein the bottom rim is positioned to continuously surround the plurality of walls of the plastic box when the plastic box is mated to the plastic cover.

3. The junction box system of claim 1 wherein the portion of the plastic cover is a first tab extending from the plastic cover, and wherein the plastic cover and the plastic box are also mated via a second channel positioned outside a wall of the plastic box, the second channels also having an open top and a side spaced away from a wall of the plastic box, the space of the second channel configured to receive a second tab extending from the plastic cover.

4. The junction box system of claim 1 wherein the plastic cover comprises ABS plastic and the plastic box comprises ABS plastic, and wherein the plastic cover includes a plurality of connector tabs extending from the cover, the connector tabs positioned to mate with corresponding channels of the plastic box.

5. The junction box system of claim 1 wherein the base portion includes a plurality of rectangular channels, the channels sized and positioned to receive electrical components secured to the printed circuit board mounted within the plastic box.

6. The junction box system of claim 1, further comprising a heat generating electrical component in electrical connection with the printed circuit board, the heat generating electrical component being mounted on a thermal interface.

7. The junction box system of claim 6, wherein the heat generating electrical component is a bypass diode.

8. The junction box system of claim 1 further comprising:
   a thermally conductive plate mounted within the box between the plastic cover and a first side of the printed circuit board; and
   a thermal interface mounted on a second side of the printed circuit board, the thermal interface not in contact with the thermally conductive plate or the plastic cover.

9. The junction box system of claim 1 wherein the bottom rim is positioned to continuously surround the plurality of walls of the plastic box when the plastic box is mated to the plastic cover.

10. A junction box system comprising:
    a cover having a planar surface and a plurality of connector tabs extending from the cover;
    a box bottom, the box bottom including a plurality of walls and a base portion connected to each of the walls, the box bottom configured to mate with the cover, the box bottom having a plurality of receptacles positioned outside of the walls of the box bottom, the receptacles each having an open top and open channel, the receptacles sized and each configured to receive and secure the connector tabs through the open top and into the open channel when the cover is mated with the box bottom, the cover is further configured to engage with the walls and when engaged to the walls form a seal serving to protect components placed inside of the mated box bottom and cover;
    a printed circuit board comprising a microcontroller, the printed circuit board positioned between the cover and box bottom, the printed circuit board having a first side facing the cover and a second side facing the box bottom;
    a plurality of electrical terminals secured to the box bottom, the plurality of electrical terminals providing connection points for electronics of the printed circuit board to connect with at least one solar panel lead; and
    an inductor electrically coupled to the printed circuit board and extending beyond the second side and towards the box bottom,
    wherein the cover further comprises a rim projecting away from a bottom side of the cover and towards the box bottom when the box bottom and the cover are mated, the rim positioned to be around and outside outfacing surfaces of each of the walls of the plurality of walls when the box bottom and the cover are mated.

11. The junction box system of claim 10 wherein the connector tabs are rectangular and wherein the open channels each have parallel inner sides.

12. The junction box system of claim 10 wherein the cover has rounded corners.

13. The junction box system of claim 12 wherein walls of the plurality of walls are connected to each other and form a rectangular shape with rounded corners, the corners mimicking rounded corners of the cover.

14. The junction box system of claim 10 wherein the connector tabs have a distal end with a ridge, the ridge sized to engage the receptacle when the cover is mated with the box bottom.

15. The junction box system of claim 10 wherein the first solar panel connector comprises threaded connections.

16. The junction box system of claim 10 wherein the box bottom includes a plurality of rectangular channels, the channels sized and positioned to receive electrical components secured to the printed circuit board mounted within the box bottom.

17. The junction box system of claim 10, further comprising a first magnetic core half mounted within the box between a thermally conductive pad and the box bottom; and a second magnetic core half mounted within the box between the first magnetic core half and the box bottom.

18. The junction box system of claim 10 further comprising:
   a heat spreader mounted within the box between the cover and the box bottom, the heat spreader having a first side facing the cover and a second side facing the box bottom; and
   a thermally conductive pad mounted within the box between the second side of the heat spreader and the box bottom.

19. The junction box system of claim 10 wherein the open channels each have rectangular shaped channels.

20. A junction box system comprising:
   a cover having an upper surface and a plurality of connector tabs extending from the cover;
   a box bottom, the box bottom including a plurality of walls and a base portion connected to each of the walls, the box bottom configured to mate with the cover, the box bottom having a plurality of receptacles positioned outside of the walls of the box bottom, the receptacles each having an open top and open channel, each of the receptacles sized and each configured to receive and secure the connector tabs through the open top and into the open channel when the cover is mated with the box bottom, the cover is further configured to engage with the walls and when engaged to the walls form a seal serving to protect components placed inside of the mated box bottom and cover;
   a printed circuit board comprising a microcontroller, the printed circuit board positioned between the cover and box bottom, the printed circuit board having a first side facing the cover and a second side facing the box bottom;
   and
   a plurality of electrical terminals secured to the box bottom, the plurality of electrical terminals providing connection points for electronics of the printed circuit board to connect with at least one solar panel lead,
   wherein the cover further comprises a rim projecting away from a bottom side of the cover and towards the box bottom when the box bottom and the cover are mated, the rim positioned and configured to be juxtaposed and outside an outwardly facing planar surface of each of the walls of the plurality of walls when the box bottom and the cover are mated,
   wherein the planar surface of each of the walls of the plurality of walls extends between an upper outermost perimeter edge of each of the walls and the box bottom.

* * * * *